US009048407B2

(12) United States Patent
Koyama et al.

(10) Patent No.: US 9,048,407 B2
(45) Date of Patent: Jun. 2, 2015

(54) MOUNTING METHOD FOR SEMICONDUCTOR LIGHT EMITTER USING RESIST WITH OPENINGS OF DIFFERENT SIZES (75) Inventors: Yasuhiro Koyama, Osaka (JP); Katsuji Kawakami, Osaka (JP); Mutsuo Kawasaki, Osaka (JP); Osamu Miyake, Osaka (JP); Hajime Oda, Osaka (JP); Keiichi Sawai, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 256 days.

(21) Appl. No.: 13/697,766

(22) PCT Filed: Jun. 8, 2011

(86) PCT No.: PCT/JP2011/063168
§ 371 (c)(1),
(2), (4) Date: Nov. 13, 2012

(87) PCT Pub. No.: WO2012/026182
PCT Pub. Date: Mar. 1, 2012

(65) Prior Publication Data
US 2013/0065331 A1    Mar. 14, 2013

(30) Foreign Application Priority Data
Aug. 26, 2010   (JP) .................. 2010-189382

(51) Int. Cl.
*H01L 21/00*   (2006.01)
*H01L 33/62*   (2010.01)
(Continued)

(52) U.S. Cl.
CPC ................ *H01L 33/62* (2013.01); *H01L 24/17* (2013.01); *H01L 33/38* (2013.01);
(Continued)

(58) Field of Classification Search
CPC ................ H01L 2924/00; H01L 2924/00014; H01L 2924/12041; H01L 33/642; H01L 2224/49171; H01L 33/38; H01L 2224/14051; H01L 2225/06513; H01L 2224/06102; H01L 2224/1403; H01L 2224/12041; H01L 2224/13099; H01L 2224/1411; H01L 2224/1703; H01L 24/14; H01L 24/17
USPC ..................................... 438/26; 257/E33.057
See application file for complete search history.

(56) References Cited
U.S. PATENT DOCUMENTS
2005/0110161 A1* 5/2005 Naito et al. .................... 257/778
2007/0069346 A1* 3/2007 Lin et al. ........................ 257/673
(Continued)

FOREIGN PATENT DOCUMENTS
JP       3-190136       8/1991
JP       2002-118137    4/2002
(Continued)

OTHER PUBLICATIONS
International Search Report mailed Jul. 19, 2011, directed to International Application No. PCT/JP2011/063168; 7 pages.

*Primary Examiner* — Duy T Nguyen
(74) *Attorney, Agent, or Firm* — Morrison & Foerster LLP (57) ABSTRACT The present invention is a method for mounting, on a ceramic substrate (9), an LED chip (1), in which an upper surface of a positive electrode (6) is in a higher position than an upper surface of a negative electrode (5). The method includes the steps of: (i) laminating resist (16) on the negative electrode (5) and the positive electrode (6) and forming openings (16*a* and 16*b*) in the resist (16); (ii) forming bumps (11 and 12) in the respective openings (16*a* and 16*b*); (iii) removing the resist (16); and (iv) bonding bumps (11 and 12) to the ceramic substrate (9). A cross-sectional area of the opening (16*a*) is larger than a cross-sectional area of the opening (16*b*).

7 Claims, 6 Drawing Sheets (51) Int. Cl.
*H01L 23/00* (2006.01)
*H01L 33/38* (2010.01)

(52) U.S. Cl.
CPC ............... *H01L 2224/13099* (2013.01); *H01L 2924/01004* (2013.01); *H01L 2924/01079* (2013.01); *H01L 2933/0066* (2013.01); *H01L 2924/01005* (2013.01); *H01L 2924/01006* (2013.01); *H01L 2924/01033* (2013.01); *H01L 2224/1703* (2013.01); *H01L 2224/1411* (2013.01); *H01L 24/14* (2013.01); *H01L 2224/06102* (2013.01); *H01L 2224/1403* (2013.01); *H01L 2924/12041* (2013.01)

(56) References Cited

U.S. PATENT DOCUMENTS

2008/0050906 A1* 2/2008 Lee et al. ............... 438/614
2009/0039376 A1   2/2009 Uemoto et al.
2009/0085052 A1*  4/2009 Ko et al. ............... 257/98
2010/0252855 A1  10/2010 Kamei

FOREIGN PATENT DOCUMENTS

| | | |
|---|---|---|
| JP | 2003-142829 | 5/2003 |
| JP | 2003-273408 | 9/2003 |
| JP | 2004-103975 | 4/2004 |
| JP | 2004-146757 | 5/2004 |
| JP | 2004-153110 | 5/2004 |
| JP | 2004-335660 | 11/2004 |
| JP | 2005-136399 | 5/2005 |
| JP | 2006-74007 | 3/2006 |
| WO | WO-2009/063638 | 5/2009 |

* cited by examiner

MOUNTING METHOD FOR SEMICONDUCTOR LIGHT EMITTER USING RESIST WITH OPENINGS OF DIFFERENT SIZES

REFERENCE TO RELATED APPLICATIONS

This application is a national stage application under 35 USC 371 of International Application No. PCT/JP2011/063168, filed Jun. 8, 2011, which claims priority from Japanese Patent Application No. 2010-189382 filed Aug. 26, 2010, the entire contents of which are incorporated herein by reference.

FIELD OF THE INVENTION

The present invention relates to a mounting method for mounting a semiconductor light-emitting element by means of flip-chip mounting.

BACKGROUND OF THE INVENTION

Conventionally, a wire-bonding method has been used for mounting an LED (light-emitting diode) chip on a ceramic substrate (mounting substrate) or the like. However, the wire-bonding method has a problem, for example, that miniaturization is difficult because an area for connecting a wire is required on the ceramic substrate. Moreover, a shadow of the wire is formed when light emitted from the LED chip is applied to the wire, and this results in decreasing a luminous efficiency. Thus, in recent years, a method known as a flip-chip mounting method, in which an electrode of the LED chip is mounted so as to face the ceramic substrate, has been proposed.

Figure 5:
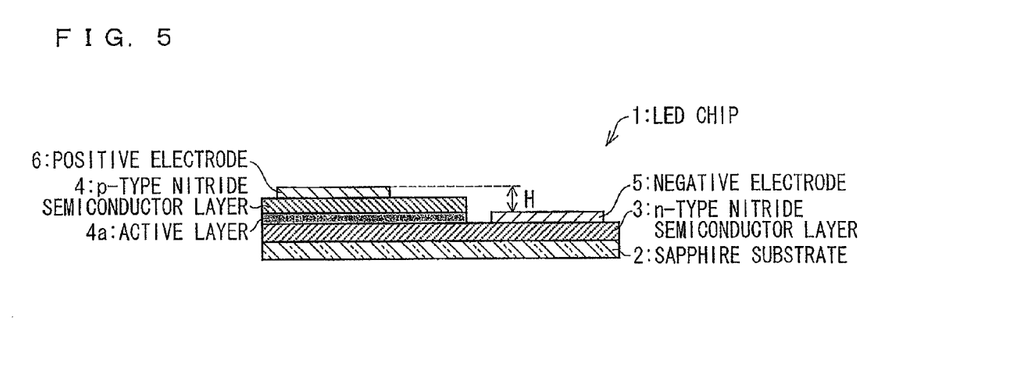
FIG. 5 is a cross-sectional view of an LED chip in which a sapphire substrate is employed.

FIG. 5 is a cross-sectional view of an LED chip 1 in which a sapphire substrate is employed. The LED chip 1 includes a sapphire substrate 2, an n-type nitride semiconductor layer 3, a p-type nitride semiconductor layer 4, a negative electrode 5, and a positive electrode 6. By impressing a forward voltage between the negative electrode 5 and the positive electrode 6, an electron and a hole are combined so as to emit light in an active layer 4a near a boundary between the n-type nitride semiconductor layer 3 and the p-type nitride semiconductor layer 4.

Whereas the negative electrode 5 is formed on an upper surface of the n-type nitride semiconductor layer 3, the positive electrode 6 is formed on an upper surface of the p-type nitride semiconductor layer 4, which is laminated on the upper surface of the n-type nitride semiconductor layer 3. As such, there is a difference H in height between an upper surface of the negative electrode 5 and an upper surface of the positive electrode 6. As a result, when the LED chip 1 is mounted on the ceramic substrate in the flip-chip mounting method, there is a problem as described below.

Figure 6:
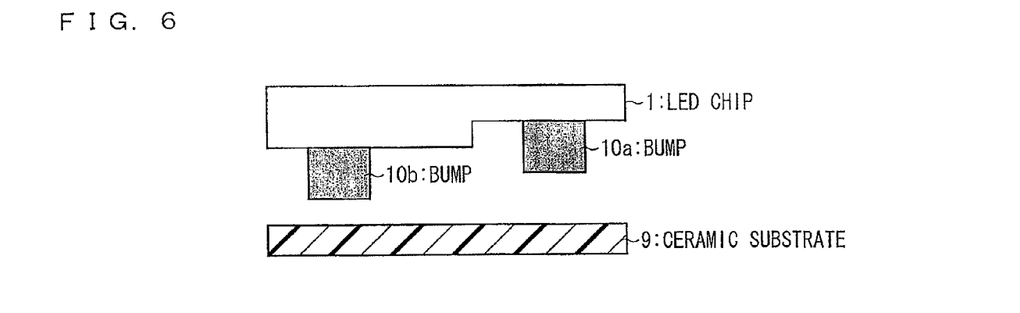
FIG. 6 is a cross-sectional view illustrating a state in which the LED chip illustrated in FIG. 5 is to be mounted on a ceramic substrate via two bumps.

FIG. 6 is a cross-sectional view illustrating a state in which the LED chip 1 is to be mounted on a ceramic substrate 9 via two bumps: a bump 10a and a bump 10b. A size of the bump 10a and a size of the bump 10b are the same. The bump 10a is formed on the negative electrode 5 of the LED chip 1, and the bump 10b is formed on the positive electrode 6 of the LED chip 1. As described above, there is a difference in height between the negative electrode 5 and the positive electrode 6 of the LED chip 1. Because of this, a height of a surface of the bump 10a and a height of a surface of the bump 10b are different from each other. Therefore, when the LED chip 1 is flip-chip mounted on the ceramic substrate 9 in a state as illustrated in FIG. 6, the LED chip 1 is inclined with respect to the ceramic substrate 9. As a result, a directivity of light emitted from the LED chip 1 decreases.

Figure 7:
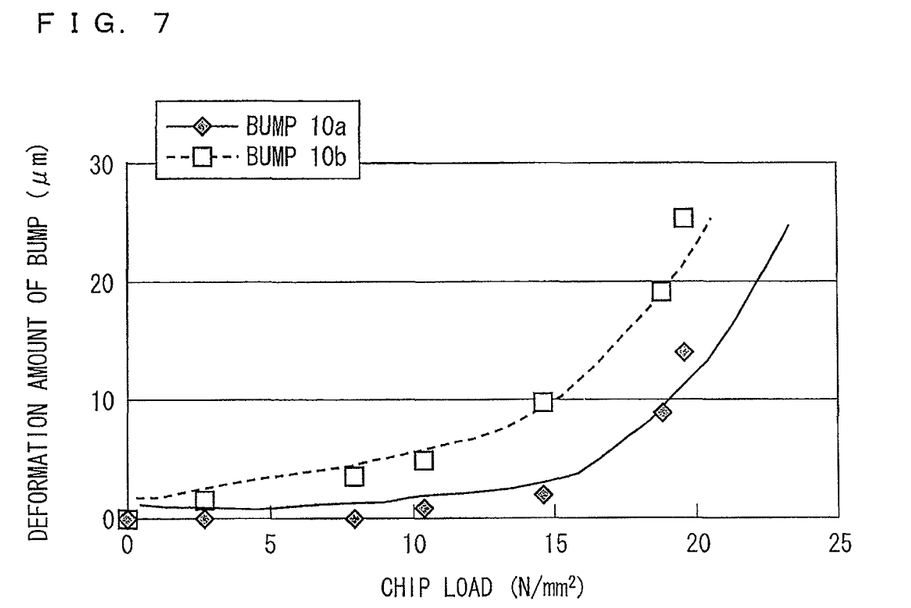
FIG. 7 is a graph showing a relation between a load applied to the entire LED chip and an amount of deformation of each of the two bumps.

FIG. 7 is a graph showing a relation between a load applied to the entire LED chip 1 and an amount of deformation of each of the bump 10a and the bump 10b. For example, in a case of deforming the bump 10b by 10 µm, a load of approximately 14 N/mm$^2$ needs to be applied to the entire LED chip 1. On the other hand, in a case of deforming the bump 10a by 10 µm, a load of approximately 20 N/mm$^2$ needs to be applied to the entire LED chip 1. Thus, in a case of deforming the bump 10a to the same extent as the bump 10b, a load to be applied to the entire LED chip 1 increases approximately 1.5 times. Therefore, when the bump 10a and the bump 10b are compressed in order to eliminate a difference in height between the bump 10a and the bump 10b, a large load is applied to an element in a lower layer of the positive electrode 6. This causes the element to be damaged.

In order to solve the problem, for example, Patent Literature 1 describes a method for (i) forming balls (bumps) by melting an end section of a metal wire at an end section of a capillary, (ii) causing the balls to be adhered to an electrode surface, and (iii) subsequently causing the end section of the capillary to slide on the balls substantially in parallel with respect to the electrode surface so that the balls have the same height.

Japanese Patent Application Publication, Tokukai, No. 2002-118137 A (Publication Date: Apr. 19, 2002)

SUMMARY OF THE INVENTION

However, the method described in Patent Literature 1 has a problem that a long time is required to create a bump because the end section of the capillary is slid on a ball after the ball is adhered to the electrode surface.

The present invention is accomplished in view of the conventional problem described above. An object of the present invention is to provide a method for mounting a semiconductor light-emitting element having an excellent luminous characteristic and excellent productivity.

In order to attain the object, a method of the present invention, for mounting a semiconductor light-emitting element on a substrate via a bump, is a method for mounting a semiconductor light-emitting element, the semiconductor light-emitting element including a first electric-conductivity-type semiconductor layer; a second electric-conductivity-type semiconductor layer laminated on a part of an upper surface of the first electric-conductivity-type semiconductor layer; a first electrode section formed on another part of the upper surface of the first electric-conductivity-type semiconductor layer; and a second electrode section formed on an upper surface of the second electric-conductivity-type semiconductor layer, an upper surface of the second electrode section being in a higher position than an upper surface of the first electrode section with respect to the first electric-conductivity-type semiconductor layer, the method including the steps of: (i) laminating resist on the first electrode section and the second electrode section and forming (a) one or more first openings at a part of the resist which part corresponds to the first electrode section and (b) one or more second openings at a part of the resist which part corresponds to the second electrode section; (ii) forming one or more first bumps in the respective one or more first openings and forming one or more second bumps in the respective one or more second openings; (iii) removing the resist; and (iv) bonding the one or more first bumps and the one ore more second bumps to the substrate, a cross-sectional area of each of the one or more first openings being larger than a cross-sectional area of each of the one or more second openings.

The semiconductor light-emitting element has a configuration in which the upper surface of the second electrode section is in a higher position than the upper surface of the first electrode section. As such, in a case where bumps having the same height are formed respectively on the first electrode section and the second electrode section and then bonded to the substrate, the semiconductor light-emitting element is inclined with respect to the substrate.

As such, in the step (i) for forming, in the resist, an opening for forming a bump in the method for mounting the semiconductor light-emitting element in accordance with the present invention, (a) the one or more first openings are formed at the part of the resist which part corresponds to the first electrode section, and the one or more second openings are formed at the part of the resist which part corresponds to the second electrode section, and (b) the cross-sectional area of each of the one or more first openings is larger than the cross-sectional area of each of the one or more second openings. This causes the one or more first bumps to be formed at a speed faster than a speed at which the one or more second bumps are formed in the step (ii). Accordingly, the first bump can be made higher than the second bump. This allows a difference in height between an upper surface of each of the one or more first bumps and an upper surface of each of the one or more second bumps to be smaller than a difference in height between the upper surface of the first electrode section and the upper surface of the second electrode section. Accordingly, in the step (iv), it is possible to reduce an inclination of the semiconductor light-emitting element with respect to the substrate, and as a result, a luminous characteristic of the semiconductor light-emitting element increases.

Moreover, in the mounting method described above, by merely setting cross-sectional areas of openings in the resist to be different from each other, it is possible to form bumps which differ in height. Therefore, unlike the invention in accordance with Patent Literature 1, it is possible to form bumps in a short time. This makes it possible to provide a method for mounting a semiconductor light-emitting element having an excellent luminous characteristic and excellent productivity.

As described above, a method of the present invention, for mounting a semiconductor light-emitting, includes the steps of: (i) laminating resist on the first electrode section and the second electrode section and forming (a) one or more first openings at a part of the resist which part corresponds to the first electrode section and (b) one or more second openings at a part of the resist which part corresponds to the second electrode section; (ii) forming one or more first bumps in the respective one or more first openings and forming one or more second bumps in the respective one or more second openings; (iii) removing the resist; and (iv) bonding the one or more first bumps and the one ore more second bumps to the substrate, a cross-sectional area of each of the one or more first openings being larger than a cross-sectional area of each of the one or more second openings. Therefore, it is possible to provide a method for mounting a semiconductor light-emitting element having an excellent luminous characteristic and excellent productivity.

DETAILED DESCRIPTION OF THE INVENTION

One embodiment of the present invention is described below with reference to FIGS. 1 through 5.

Figure 1:
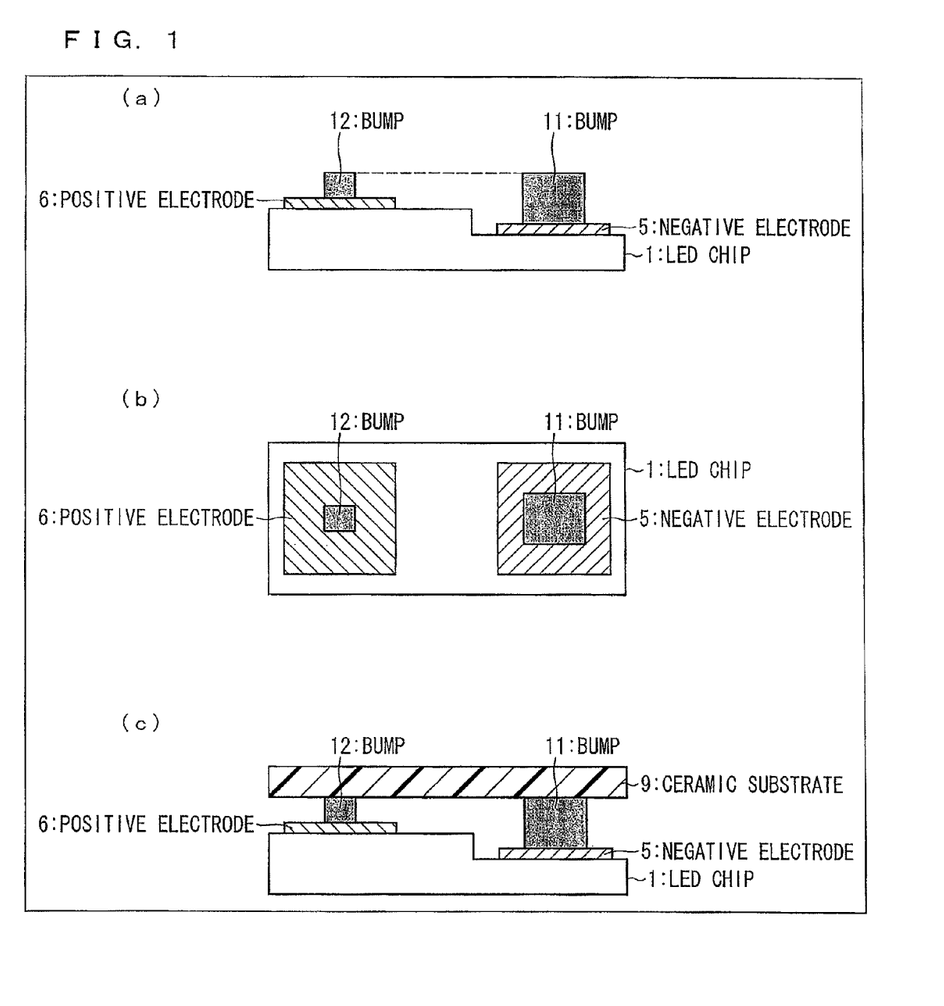
FIG. 1 is a view illustrating a mounting method in accordance with an embodiment of the present invention.

FIG. 1 is a view illustrating a mounting method in accordance with the present embodiment. Specifically, (a) of FIG. 1 is a cross-sectional view illustrating a state in which a bump 11 and a bump 12 have been formed on an LED chip 1. (b) of FIG. 1 is a plan view illustrating a surface of the LED chip 1 in the state, on which surface electrodes are provided. (c) of FIG. 1 is a cross-sectional view illustrating a state in which the LED chip 1 illustrated in (a) of FIG. 1 has been mounted on the ceramic substrate 9.

The LED chip 1 is the same as the LED chip illustrated in FIG. 5. That is, as illustrated in FIG. 5, the LED chip (semiconductor light-emitting element) 1 includes a sapphire substrate 2, an n-type nitride semiconductor layer (first electric-conductivity-type semiconductor layer) 3, a p-type nitride semiconductor layer (second electric-conductivity-type semiconductor layer) 4, a negative electrode (first electrode section) 5, and a positive electrode (second electrode section) 6. The n-type nitride semiconductor layer 3 is laminated on the sapphire substrate 2, and a part of an upper surface of the n-type nitride semiconductor layer 3 is exposed. The p-type nitride semiconductor layer 4 is laminated on a part of the upper surface of the n-type nitride semiconductor layer 3, and the negative electrode 5 is formed on another part of the upper surface of the n-type nitride semiconductor layer 3. The positive electrode 6 is formed on an upper surface of the p-type nitride semiconductor layer 4.

By impressing a forward voltage between the negative electrode 5 and the positive electrode 6, an electron and a hole are combined so as to emit light in an active layer 4a near a boundary between the n-type nitride semiconductor layer 3 and the p-type nitride semiconductor layer 4. The negative electrode 5 is formed on the upper surface of the n-type nitride semiconductor layer 3, whereas the positive electrode 6 is formed on the upper surface of the p-type nitride semiconductor layer 4, which is laminated on the upper surface of the n-type nitride semiconductor layer 3. As such, there is a difference H in height between an upper surface of the negative electrode 5 and an upper surface of the positive electrode 6. Therefore, in a case where bumps having the same height are formed respectively on the negative electrode 5 and the positive electrode 6 and then bonded to the ceramic substrate, the LED chip 1 is inclined with respect to the ceramic substrate.

As such, in the present embodiment, as illustrated in (a) of FIG. 1, (i) the bump 11 (first bump) and the bump 12 (second bump) are formed on the negative electrode 5 and the positive electrode 6, respectively, as bumps for a flip-chip mounting of the LED chip 1 and (ii) as to sizes of the bump 11 and the bump 12, the bump 11 is higher than the bump 12. In addition, as illustrated in (b) of FIG. 1, a cross-sectional area of the bump 11 (area of a cross section in parallel with respect to the n-type nitride semiconductor layer 3) is larger than a cross-sectional area of the bump 12.

Accordingly, as illustrated in (a) of FIG. 1, an upper surface of the bump 11 and an upper surface of the bump 12 have substantially the same height with respect to the n-type nitride semiconductor layer 3. As such, as illustrated in (c) of FIG. 1, in a case where the LED chip 1 is flip-chip mounted on the ceramic substrate 9, the n-type nitride semiconductor layer 3 and the p-type nitride semiconductor layer 4 of the LED chip 1 are in parallel with respect to the ceramic substrate 9. As a result, a directivity of light emitted from the LED chip 1 increases.

Next, details of a method for mounting the LED chip 1 is described with reference to FIG. 2. In the present embodiment, the bump 11 and the bump 12 for a flip-chip mounting of the LED chip 1 are formed by using Au plating applied by electrolytic plating.

Figure 2:
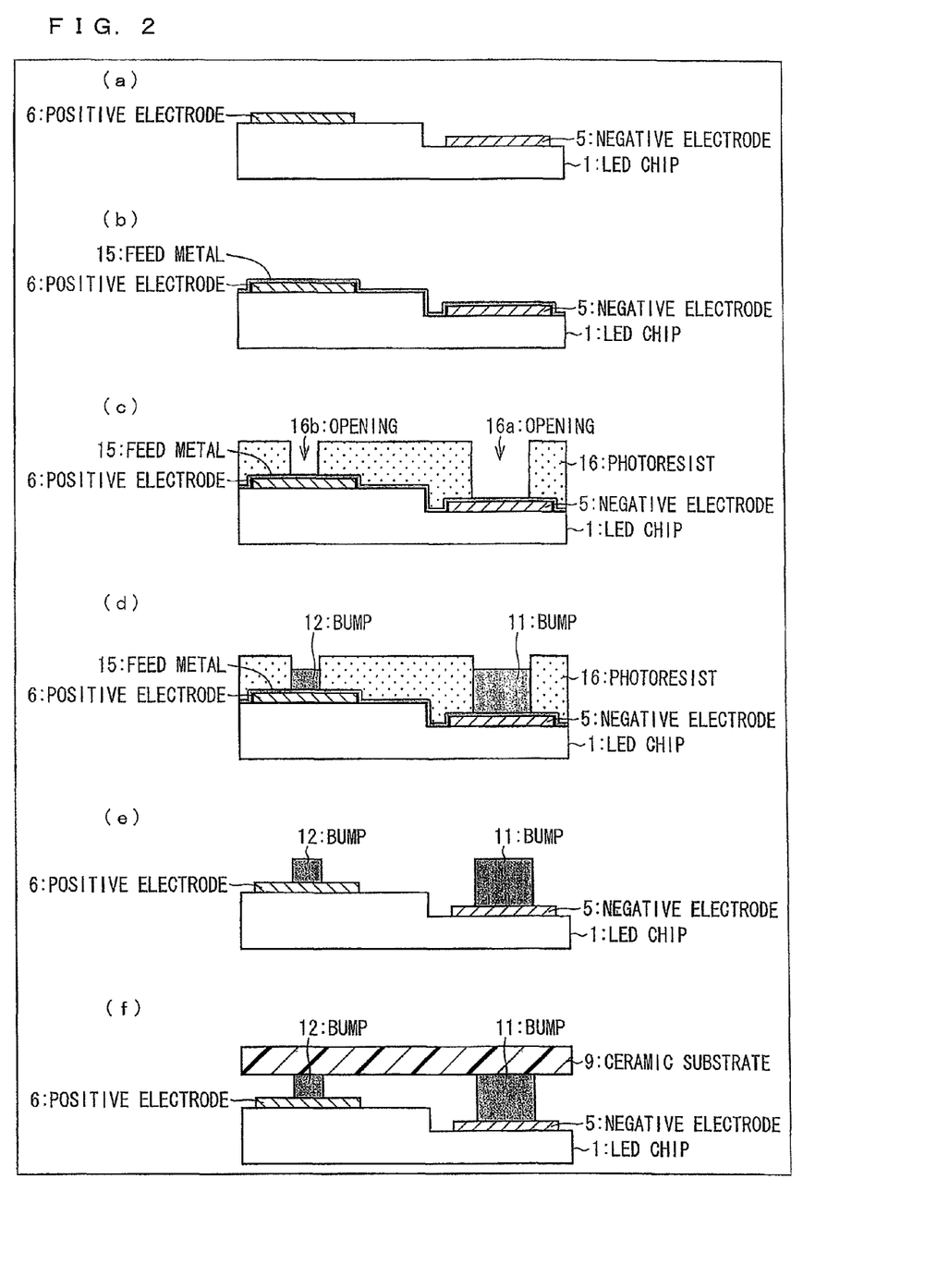
FIG. 2 is a cross-sectional view illustrating a method for mounting an LED chip.

(a) of FIG. 2 illustrates the LED chip 1 before a bump is formed. As illustrated in (b) of FIG. 2, a feed metal 15 is formed on a surface of the LED chip 1 by sputtering, on which surface the negative electrode and the positive electrode are provided. The feed metal 15 is constituted by an Au film, which serves as a seed layer, and a barrier film, which prevents Au from diffusing to the ceramic substrate.

Then, resist 16 is laminated on the negative electrode 5 and the positive electrode 6, and as illustrated in (c) of FIG. 2, an opening 16a (first opening) is formed, by patterning, at a part of the resist 16 which part corresponds to the negative electrode 5, and an opening 16b (second opening) is formed, by patterning, at a part of the resist 16 which part corresponds to the positive electrode 6 (opening-forming step).

Next, after the bump 11 and the bump 12 are formed in the opening 16a and the opening 16b, respectively ((d) of FIG. 2, bump-forming step), the feed metal 15 and the resist 16 are removed ((e) of FIG. 2, resist-removing step), and the bump 11 and the bump 12 are bonded to the ceramic substrate 9 ((f) of FIG. 2, bonding step). As a result, the LED chip 1 is mounted on the ceramic substrate 9.

In the opening-forming step illustrated in (c) of FIG. 2, the opening 16a and the opening 16b are formed so that a cross-sectional area of the opening 16a is larger than a cross-sectional area of the opening 16b. This causes the bump 11 to be formed at a speed faster than a speed at which the bump 12 is formed. Accordingly, the bump 11 can be made higher than the bump 12.

Figure 3:
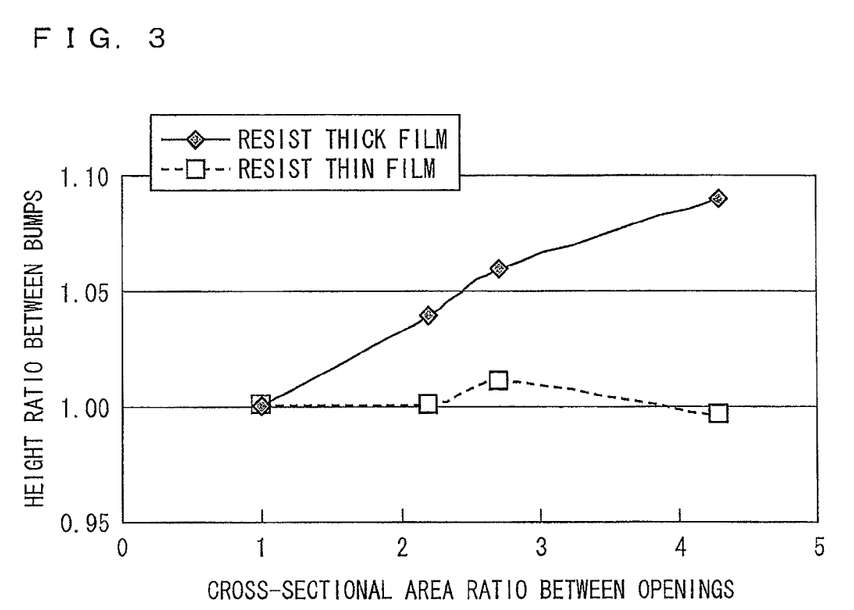
FIG. 3 is a graph showing a relation between (i) a cross-sectional area ratio between two openings in resist and (ii) a height ratio between bumps formed in the respective openings.

FIG. 3 is a graph showing a relation between (i) a cross-sectional area ratio of the opening 16a to the opening 16b and (ii) a height ratio of the bump 11 to the bump 12. As indicated by the solid line, in a case where the resist 16 is thick enough, the higher the cross-sectional ratio is, the higher the height ratio is.

By making use of this characteristic, the cross-sectional area of the opening 16a and the cross-sectional area of the opening 16b are selected in accordance with a difference in height between the negative electrode 5 and the positive electrode 6. Specifically, the cross-sectional area of the opening 16a and the cross-sectional area of the opening 16b are set so that a difference in height between the bump 11 and the bump 12 is the same as a difference in height between the negative electrode 5 and the positive electrode 6. For example, the cross-sectional area of the opening 16b is set to approximately 300 µm² to 5,000 µm². This allows the upper surface of the bump 11 and the upper surface of the bump 12 to have substantially the same height with respect to the n-type nitride semiconductor layer 3, as illustrated in (e) of FIG. 2.

Note that in FIG. 3, as indicated by the broken line, in a case where the resist 16 is thin, the height ratio of the bump 11 to the bump 12 hardly changes even when the cross-sectional area ratio of the opening 16a to the opening 16b becomes high. As such, in the bump-forming step illustrated in (d) of FIG. 2, it is preferable that (i) a difference between the height of the upper surface of the bump 11 with respect to the n-type nitride semiconductor layer 3 and a height of the upper surface of the resist 16 with respect to the n-type nitride semiconductor layer 3 be 10 µm or more and (ii) a difference between the height of the upper surface of the bump 12 with respect to the n-type nitride semiconductor layer 3 and the height of the upper surface of the resist 16 with respect to the n-type nitride semiconductor layer 3 be 10 µm or more. This allows the height of the bump 11 and the bump 12 to be controlled easily.

As described above, in the method for mounting the LED chip 1 in accordance with the present embodiment, by controlling the height of the bump 11 and the height of the bump 12, it is possible to make the height of the upper surface of the bump 11 with respect to the n-type nitride semiconductor layer 3 equal to the height of the upper surface of the bump 12 with respect to the n-type nitride semiconductor layer 3. This makes it possible to mount the LED chip 1 on the ceramic electrode 9 without deteriorating a contact resistance or a mechanical strength. Consequently, a directivity of the light emitted from the LED chip 1 increases.

In the configuration described above, one bump is formed on each of the negative electrode 5 and the positive electrode 6 of the LED chip 1. In contrast, the following description will discuss a configuration in which a plurality of bumps are formed on the positive electrode 6 so as to achieve an increase in bonding strength and a decrease in contact resistance.

Figure 4:
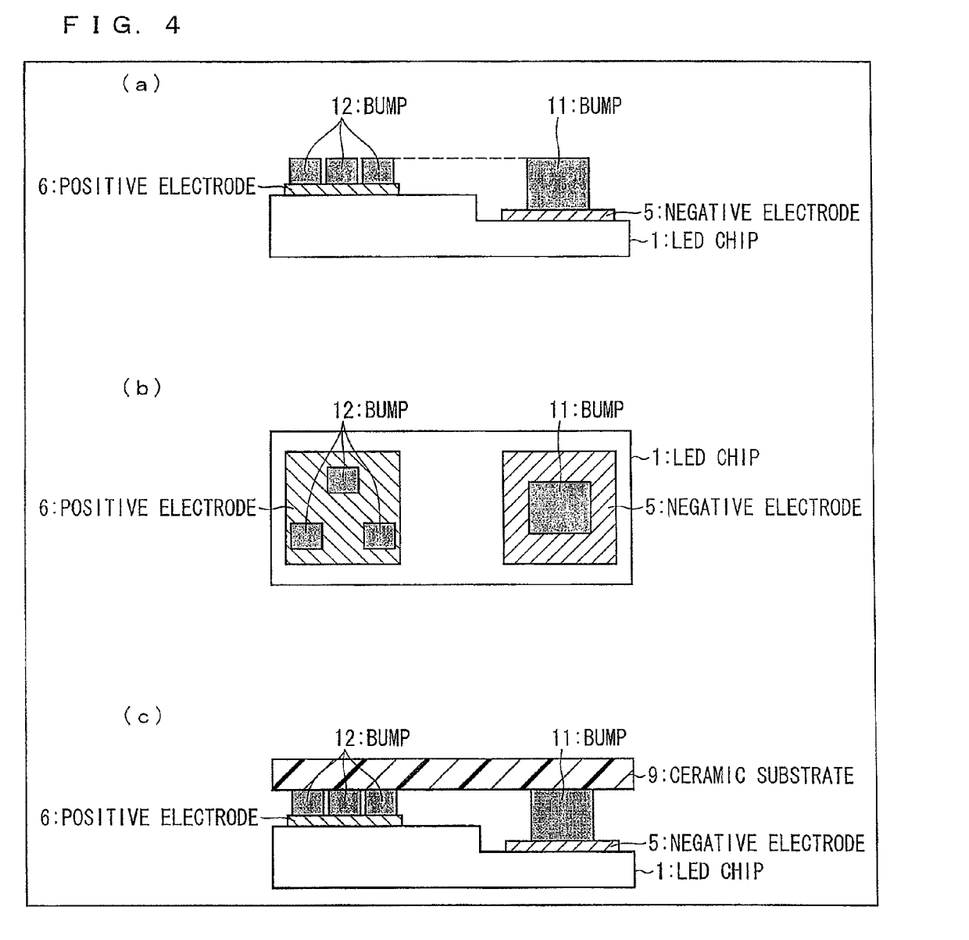
FIG. 4 is a view illustrating a modified example of the mounting method in accordance with the present embodiment.

FIG. 4 is a view illustrating a modified example of the mounting method in accordance with the present embodiment. Specifically, (a) of FIG. 4 is a cross-sectional view illustrating a state in which a bump 11 and three bumps 12 are formed on the LED chip 1. (b) of FIG. 4 is a plan view illustrating a surface of the LED chip 1 in the state, on which surface the negative electrode and the positive electrode are provided. (c) of FIG. 4 is a cross-sectional view illustrating a state in which the LED chip 1 illustrated in (a) of FIG. 4 is mounted on the ceramic substrate 9. A configuration illustrated in FIG. 4 is the same as the configuration illustrated in FIG. 1, except that three bumps 12 are formed on the positive electrode 6 of the LED chip 1.

A cross-sectional area of the bump 12 is smaller than the cross-sectional area of the bump 11. On the other hand, when the LED chip 1 is mounted, a load applied to the bump 11 is approximately the same as a load applied to the bump 12. As such, in the state illustrated in (c) of FIG. 1, the bump 12 deforms more easily than the bump 11. Moreover, since a bonding area between the bump 12 and the positive electrode 6 is small, there is a possibility that a bonding strength is not enough and/or a contact resistance becomes large.

In view of this, as illustrated in FIG. 4, the larger number of bumps 12 are formed on the positive electrode 6, so that load applied to each of the bumps 12 can be reduced. This allows preventing deformation of the bumps 12. In addition, it becomes possible to increase the bonding strength and reduce the contact resistance. This allows the flip-chip mounting to be carried out more stably.

In a case where, as described above, the larger number of bumps 12 than the bump 11 are formed on the negative electrode 5, a larger number of opening 16b than the opening 16a should be formed in the opening-forming step illustrated in (c) of FIG. 2.

Note that although one bump 11 is formed in FIG. 4, it is possible to form a plurality of bumps 11.

Furthermore, it is preferable to minimize a difference between (i) a sum total of a cross-sectional area(s) of the bump(s) 11 and a sum total of cross-sectional areas of the respective bumps 12. As such, in the opening-forming step illustrated in (c) of FIG. 2, the number of the openings 16b is set so that a difference between a sum total of cross-sectional areas of respective one or more openings 16a and a sum total of cross-sectional areas of the respective openings 16b is a minimum value. For example, in a case where (i) there is one opening 16a and (ii) a cross-sectional area ratio of the opening 16a to the opening 16b is 7:3, two openings 16b should be formed. In a case where the cross-sectional area ratio is 8:3, three openings 16b should be formed.

Thus, the flip-chip mounting can be carried out more stably by setting the number of the opening(s) 16a and the number of the openings 16b (i.e., the number of the bump(s) 11 and the number of the bumps 12) so that the difference between the sum total of the cross-sectional area(s) of the bump(s) 11 and the sum total of the cross-sectional areas of the respective bumps 12 is small.

Note that the more the number of openings formed on the resist 16 increases, the more detailed patterning is required. As such, it is preferable that the cross-sectional area of each of the opening(s) 16a be ten times or less as large as the cross-sectional area of each of the openings 16b. In this case, as shown in the graph in FIG. 3, an upper limit for a height ratio of the bump(s) 11 to the bumps 12 is approximately 1.2. Because of this, it is preferable that in the LED chip 1, to which the mounting method in accordance with the present embodiment is applied, a difference H in height (see FIG. 5) between the upper surface of the negative electrode 5 and the upper surface of the positive electrode 6 with respect to the n-type nitride semiconductor layer 3 be 2 μm or less.

In the embodiment described above, a bump is formed by electrolytic plating. Note, however, that it is possible to form a bump by use of other methods such as a pad method. Moreover, the LED chip 1 has a configuration in which the positive electrode 6 is in a higher position than the negative electrode 5, but it is possible to employ a configuration in which the negative electrode 5 is in a higher position than the positive electrode 6. In that case, the n-type nitride semiconductor layer 3 is laminated on the upper surface of the p-type nitride semiconductor layer 4, the positive electrode 6 is formed on the upper surface of the p-type nitride semiconductor layer 4, and the negative electrode 5 is formed on the upper surface of the n-type nitride semiconductor layer 3.

As described above, a method of the present invention, for mounting a semiconductor light-emitting element on a substrate via a bump, the semiconductor light-emitting element including: a first electric-conductivity-type semiconductor layer; a second electric-conductivity-type semiconductor layer laminated on a part of an upper surface of the first electric-conductivity-type semiconductor layer; a first electrode section formed on another part of the upper surface of the first electric-conductivity-type semiconductor layer; and a second electrode section formed on an upper surface of the second electric-conductivity-type semiconductor layer, an upper surface of the second electrode section being in a higher position than an upper surface of the first electrode section with respect to the first electric-conductivity-type semiconductor layer, the method including (i) laminating resist on the first electrode section and the second electrode section and forming (a) one or more first openings at a part of the resist which part corresponds to the first electrode section and (b) one or more second openings at a part of the resist which part corresponds to the second electrode section; (ii) forming one or more first bumps in the respective one or more first openings and forming one or more second bumps in the respective one or more second openings; (iii) removing the resist; and (iv) bonding the one or more first bumps and the one ore more second bumps to the substrate, a cross-sectional area of each of the one or more first openings being larger than a cross-sectional area of each of the one or more second openings.

The semiconductor light-emitting element described above has a configuration in which the upper surface of the second electrode section is in a higher position than the upper surface of the first electrode section. As such, in a case where bumps having the same height are formed respectively on the first electrode section and the second electrode section and then bonded to the substrate, the semiconductor light-emitting element is inclined with respect to the substrate.

As such, in the step (i) for forming, in the resist, an opening for forming a bump in the method for mounting the semiconductor light-emitting element in accordance with the present invention, (a) the one or more first openings are formed at the part of the resist which part corresponds to the first electrode section, and the one or more second openings are formed at the part of the resist which part corresponds to the second electrode section, and (b) the cross-sectional area of each of the one or more first openings is larger than the cross-sectional area of each of the one or more second openings. This causes the one or more first bumps to be formed at a speed faster than a speed at which the one or more second bumps are formed in the step (ii). Accordingly, the first bump can be made higher than the second bump. This allows a difference in height between an upper surface of each of the one or more first bumps and an upper surface of each of the one or more second bumps to be smaller than a difference in height between the upper surface of the first electrode section and the upper surface of the second electrode section. Accordingly, in the step (iv), it is possible to reduce an inclination of the semiconductor light-emitting element with respect to the substrate, and as a result, a luminous characteristic of the semiconductor light-emitting element increases.

Moreover, in the mounting method described above, by merely setting cross-sectional areas of openings in the resist to be different from each other, it is possible to form bumps which differ in height. Therefore, unlike the invention in accordance with Patent Literature 1, it is possible to form bumps in a short time. This makes it possible to provide a method for mounting a semiconductor light-emitting element having an excellent luminous characteristic and excellent productivity.

The method of the present invention is preferably arranged such that the number of the one or more second openings is larger than the number of the one or more first openings.

According to the configuration above, the number of the second opening is larger than the number of the first opening. Therefore, as compared with a case where one first bump and one second bump are formed, a difference between a sum total of a cross-sectional area(s) of the one or more first bumps and a sum total of a cross-sectional area(s) of the one or more second bumps can be made small. This makes it possible to increase a bonding strength and to reduce a contact resistance.

The method of the present invention is preferably arranged such that the number of the one or more second openings is a number that minimizes a difference between (i) a sum total of a cross-sectional area(s) of the one or more first openings and (ii) a sum total of a cross-sectional area(s) of the one or more second openings.

According to the configuration above, the difference between the sum total of the cross-sectional area(s) of the one or more first bumps and the sum total of the cross-sectional area(s) of the one or more second bumps is a minimum value. Accordingly, the flip-chip mounting can be carried out more stably.

The method of the present invention is preferably arranged such that a height of an upper surface of the first bump and a height of an upper surface of the second bump with respect to the first conductive nitride semiconductor layer are substantially the same.

According to the configuration above, the semiconductor light-emitting element can be mounted in parallel with respect to the substrate. This makes it possible to further improve a luminous characteristic of the semiconductor light-emitting element.

The method of the present invention is preferably arranged such that in the bump-forming step, a difference between a height of the upper surface of the first bump and the upper surface of the second bump with respect to the first conductive nitride semiconductor layer and a height of an upper surface of the resist with respect to the first conductive nitride semiconductor layer is 10 μm or more.

In the step (ii), in a case where a difference in height between the upper surface of the first bump and the upper surface of the second bump is 10 μm or more, a difference between a speed at which the one or more first bumps are formed and a speed at which the one or more second bumps are formed is significant. As such, by employing the configuration described above, the first bump can be made higher than the second bump more easily.

The method of the present invention is preferably arranged such that the cross-sectional area of the first opening is ten times or less as large as the cross-sectional area of the second opening.

According to the configuration above, the number of the one or more second bumps does not have to be very large in order to carry out stable flip-chip mounting. This facilitates pattering the resist in the step (i).

The method of the present invention is preferably arranged such that a difference in height between the upper surface of the first electrode section and the upper surface of the second electrode section with respect to the first conductive nitride semiconductor layer is 2 μm or less.

According to the configuration above, a cross-sectional area ratio of each of the one or more first openings to each of the one or more second openings can be made low. As such, the cross sectional area of each of the one or more second openings does not have to be made very small. This facilitates patterning the resist in the step (i).

The present invention is not limited to the above-described embodiments but allows various modifications within the scope of the claims. In other words, any embodiment derived from a combination of two or more technical means appropriately modified within the scope of the claims will also be included in the technical scope of the present invention.

The mounting method of the present invention is suitable for mounting, on a substrate, a semiconductor light-emitting element including two electrodes which differ in height.

The invention claimed is:

1. A method for mounting a semiconductor light-emitting element on a substrate via a bump,
the semiconductor light-emitting element including:
a first electric-conductivity-type semiconductor layer;
a second electric-conductivity-type semiconductor layer laminated on a part of an upper surface of the first electric-conductivity-type semiconductor layer;
a first electrode section formed on another part of the upper surface of the first electric-conductivity-type semiconductor layer; and
a second electrode section formed on an upper surface of the second electric-conductivity-type semiconductor layer,
an upper surface of the second electrode section being in a higher position than an upper surface of the first electrode section with respect to the first electric-conductivity-type semiconductor layer,
the method comprising the steps of:
(i) laminating resist on the first electrode section and the second electrode section and forming (a) one or more first openings at a part of the resist which part corresponds to the first electrode section and (b) one or more second openings at a part of the resist which part corresponds to the second electrode section;
(ii) forming one or more first bumps in the respective one or more first openings and forming one or more second bumps in the respective one or more second openings;
(iii) removing the resist; and
(iv) bonding the one or more first bumps and the one or more second bumps to the substrate,
a cross-sectional area of each of the one or more first openings being larger than a cross-sectional area of each of the one or more second openings,
wherein the cross-sectional area of each of the one or more first openings and the cross-sectional area of each of the one or more second openings are selected respectively in accordance with a difference in height between the first electrode section and the second electrode section.

2. The method as set forth in claim 1, wherein:
the number of the one or more second openings is larger than the number of the one or more first openings.

3. The method as set forth in claim 2, wherein:
the number of the one or more second openings is a number that minimizes a difference between (i) a sum total of a cross-sectional area(s) of the one or more first openings and (ii) a sum total of a cross-sectional area(s) of the one or more second openings.

4. The method as set forth in claim 1, wherein:
a height of an upper surface of each of the one or more first bumps with respect to the first electric-conductivity-type semiconductor layer and a height of an upper surface of each of the one or more second bumps with respect to the first electric-conductivity-type semiconductor layer are substantially the same.

5. The method for mounting the semiconductor light-emitting element in accordance with claim 1, wherein:
in the step (ii), (a) a difference between a height of an upper surface of each of the one or more first bumps with respect to the first electric-conductivity-type semiconductor layer and a height of an upper surface of the resist with respect to the first electric-conductivity-type semiconductor layer is 10 μm or more and (b) a difference between a height of an upper surface of each of the one or more second bumps with respect to the first electric-conductivity-type semiconductor layer and the height of the upper surface of the resist with respect to the first electric-conductivity-type semiconductor layer is 10 μm or more.

6. The method for mounting the semiconductor light-emitting element in accordance with claim 1, wherein:
the cross-sectional area of each of the one or more first openings is ten times or less as large as the cross-sectional area of each of the one or more second openings.

7. The method for mounting the semiconductor light-emitting element in accordance with claim 1, wherein:
a difference in height between the upper surface of the first electrode section and the upper surface of the second electrode section with respect to the first electric-conductivity-type semiconductor layer is 2 µm or less.

* * * * *